United States Patent [19]

Tamburro

[11] 4,155,321
[45] May 22, 1979

[54] METHOD FOR MAKING AN INTERCONNECTION PIN FOR MULTILAYER PRINTED CIRCUIT BOARDS

[75] Inventor: Peter J. Tamburro, Hanover Township, Morris County, N.J.

[73] Assignee: Bell Telephone Laboratories, Incorporated, Murray Hill, N.J.

[21] Appl. No.: 828,510

[22] Filed: Aug. 29, 1977

Related U.S. Application Data

[62] Division of Ser. No. 733,333, Oct. 18, 1976, Pat. No. 4,076,356.

[51] Int. Cl.² ............................................. B21D 53/00
[52] U.S. Cl. .................................... 113/119; 29/629; 29/630 D
[58] Field of Search ............... 29/629, 630 A, 630 C, 29/630 D; 339/17 R, 17 LM, 17 C, 17 E, 17 M, 95 R, 220 R, 221 R, 221 M, 252 P; 113/119

[56] References Cited

U.S. PATENT DOCUMENTS

| 2,820,209 | 1/1958 | Whitted | 339/125 |
| 3,072,880 | 1/1963 | Olsson | 339/17 R X |
| 3,420,087 | 1/1969 | Hatfield et al. | 72/338 |
| 3,783,433 | 1/1974 | Kurtz | 339/17 C |
| 3,964,813 | 6/1976 | Pizzeck | 339/17 M |
| 4,017,143 | 4/1977 | Knowles | 339/221 R |

Primary Examiner—C. W. Lanham
Assistant Examiner—C. J. Arbes
Attorney, Agent, or Firm—John W. Fisher

[57] ABSTRACT

A connector is disclosed for interconnecting multiple conductive layers in a printed circuit board. The connector includes a pair of elongated electrical terminals and a compliant section in between. A plurality of generally parallel raised pressure ridges are included on an outer surface of the compliant section. The connector may be advantageously divided into a plurality of semiseparate segments thereby enabling interconnection of an axially aligned track of printed circuit boards.

3 Claims, 11 Drawing Figures

METHOD FOR MAKING AN INTERCONNECTION PIN FOR MULTILAYER PRINTED CIRCUIT BOARDS

CROSS-REFERENCE TO RELATED APPLICATIONS

This is a division of application Ser. No. 733,333, filed Oct. 18, 1976 now U.S. Pat. No. 4,076,356 issued Feb. 28, 1978.

BACKGROUND OF THE INVENTION

1. Field of the Invention

This invention relates to electrical connectors and, in particular, to a connector for electrically interconnecting multiple conductive layers in a printed circuit board and a method for making such a connector.

2. Description of the Prior Art

Current objectives in circuit design include a decrease in overall physical size with a concurrent increase in component density on a printed circuit board. To meet these objectives more and more circuit designers are utilizing multilayer printed circuit boards.

One of the problems encountered in the use of multilayer boards is the electrical interconnection of the various conductive layers within the board at appropriate points. Another problem is the interconnection of discrete components or connectors to the circuit board. A third problem relates to the effectiveness of the interconnection device in maintaining a reliable, gastight connection during the life of the circuit.

Connectors which alleviate to some extent the first two problems have been disclosed in U.S. Pat. No. 3,400,358 issued to H. P. Byrnes et al on Sept. 3, 1968; U.S. Pat. No. 3,783,433 issued to H. N. Kurtz et al on Jan. 1, 1974; and U.S. Pat. No. 3,907,400 issued to R. K. Dennis on Sept. 23, 1975. However, none of these connectors adequately solves the third problem. In particular, insertion of any of these types of connectors into a plated-through hole in the multilayer board, especially where the plating is covered by oxides or other contaminants, does not ensure a reliable connection.

In some circuit applicatons it may be desirable to axially stack a number of multilayer boards atop one another to further increase the packaging density. Fabrication of a single multilayer board with an equivalent number of layers is often prohibited by cost and reliability considerations. Consequently, stacking is utilized.

While the concept of stacking is known, as evidenced by U.S. Pat. No. 3,893,233 issued to D. W. Glover on July 8, 1975, the reliability problem set out previously is not alleviated.

Accordingly, it is one object of the present invention to configure a connector which advantageously ensures a reliable connection to oxide coated or contaminated conductive platings.

Another object is to diminish the production of conductive slivers during connector insertion.

A further object of the present invention is to provide a connector which produces a nearly uniform radial pressure on conductive material on the periphery of a plated-through hole upon insertion of the connector.

Yet another object is to reduce the possibility of connector rotation during wire-wrapping operations.

Still a further object of the present invention is to facilitate axial stacking of a plurality of printed circuit boards with each board engaging a semiseparate segment of a connector.

SUMMARY OF THE INVENTION

The foregoing and other objects of the invention are realized in an illustrative embodiment of a connector for electrically interconnecting multiple conductive layers in a printed circuit board having at least one aperture with electrically conductive material about its periphery. First and second terminals are included on opposite ends of the connector for receiving electrically conductive elements. Intermediate the first and second terminals is a unitary compliant section for producing a nearly uniform radial pressure on the electrically conductive material on the periphery of the aperture upon insertion of the connector. Integral with the unitary compliant section are raised pressure members for engaging the conductive material about the aperture periphery at a plurality of discrete radial points.

Accordingly, it is one feature of the present invention that the raised pressure members penetrate the conductive material about the aperture periphery to ensure a reliable connection.

Another feature is that the raised pressure members displace portions of the conductive material thereby reducing the production of conductive slivers.

Yet another feature of the present invention is that the unitary compliant section provides a nearly uniform radial pressure on the aperture periphery upon insertion of the connector into the aperture.

A further feature is that engagement between the raised pressure members and the aperture periphery impede connector rotation as electrical connections are made to the first and second receiving terminals.

Still a further feature of the present invention is that the raised pressure members permit the passage of flux and solder between the compliant section and the conductive material on the aperture periphery.

An even further feature is that the compliant section can be advantageously segmented into a plurality of semiseparable sections to permit axial stacking of a plurality of printed circuit boards wherein each section engages an individual board.

BRIEF DESCRIPTION OF THE DRAWINGS

The aforementioned objects and features of the invention, as well as other objects and features, will be better understood upon consideration of the following detailed description and appended claims taken in conjunction with the attached drawings of an illustrative embodiment in which:

DETAILED DESCRIPTION

Figure 2:
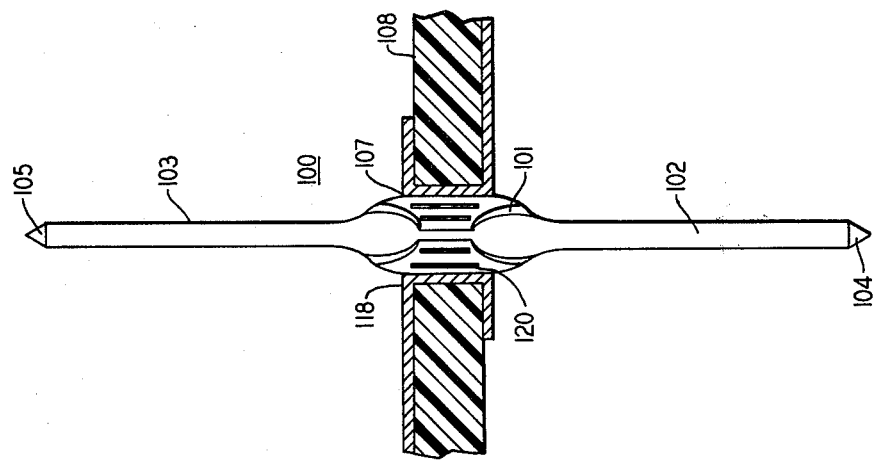
FIG. 2 illustrates the connector in engagement with a circuit board.
Figure 1:
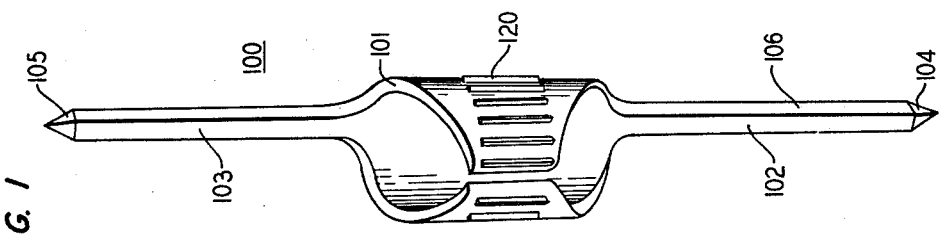
FIG. 1 is a perspective view of a connector having a single compliant central section.

An interconnection pin 100, illustrated in FIG. 1, includes a compliant section 101 and a pair of terminals 102 and 103 integral therewith and extending outwardly in opposite directions. Terminals 102 and 103 are elongated members having a generally rectangular cross section. This cross section advantageously permits electrically conductive elements to be connected to terminals 102 and 103 by techniques such as wire wrapping for example. Generally tetrahedron-shaped tips 104 and 105 at the ends of terminals 102 and 103, respectively, facilitate insertion of pin 100 into an aperture 107 in a circuit board 108, as shown in FIG. 2.

Figure 3:
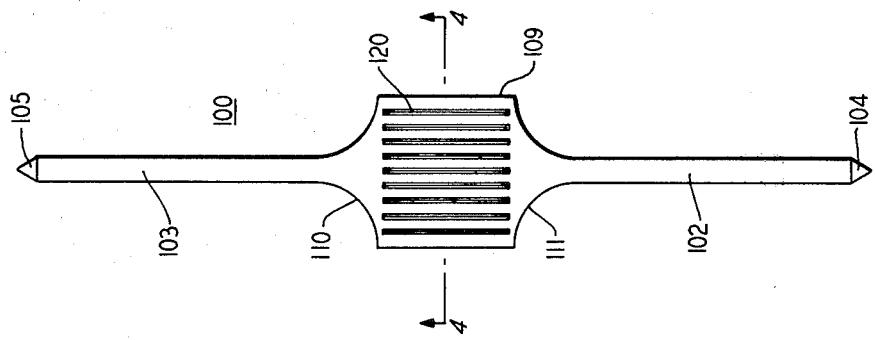
FIG. 3 is a side view of an unformed connector.
Figure 4:
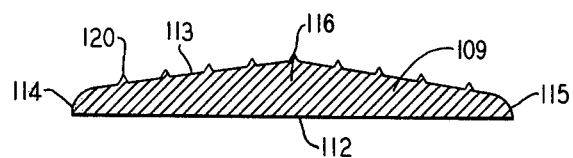
FIG. 4 is a cross-sectional view along section 4—4 of FIG. 3.

Compliant section 101 includes a generally rectangular-shaped central portion 109, as shown in its unformed state in FIG. 3, which is integrally coupled to terminals 102 and 103 by tapered cross sections 110 and 111, respectively. Tapered cross section 110 decreases in width from central portion 109 to terminal 103. Correspondingly, tapered cross section 111 decreases in width from central portion 109 to terminal 102. Central portion 109 has a nonuniform thickness between an inner surface 112 and an outer surface 113 as shown in FIG. 4. This nonuniform thickness varies from a minimum near tips 114 and 115 to a maximum in central region 116.

In its formed state, compliant section 101 has a generally cuplike-shaped cross section, as illustrated in FIGS. 5 through 8, which lies in a plane perpendicular to a plane containing an axis of symmetry of pin 100. The diameter of the cuplike-shaped cross section is slightly larger than the diameter of aperture 107 and is substantially larger than a width dimension of a side face 106 of terminal 102 as shown in FIG. 1. With the thickness and cross sectional dimensions as described, compliant section 101 produces a nearly uniform radial pressure on conductive material 118 about the periphery of aperture 107, as shown in FIG. 2, when pin 100 is brought into engagement with circuit board 108.

Along outer edge 133 of central portion 109 and integral therewith are a plurality of raised pressure ridges 120. Pressure ridges 120 are generally parallel with an axis of symmetry of pin 100, as shown in FIG. 3. Upon insertion of pin 100 into aperture 107, pressure ridges 120 engage conductive material 118 at a plurality of discrete radial points. As this engagement takes place, pressure ridges 120 break up any oxides formed on conductive material 118 and displace portions of this material thereby reducing the production of conductive slivers as pin 100 is further inserted into aperture 107. Pressure ridges 120 further permit passage of flux and solder between compliant section 101 and the periphery of conductive material 118 about the periphery of aperture 107. It should be noted also that pressure ridges 120 impede the rotation of pins 100 as a wire-wrapped connection is made with terminals 102 and 103.

Figure 5:
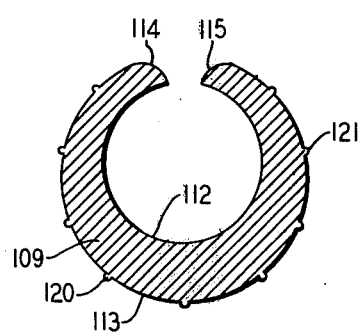
FIG. 5 is a cross-sectional view of the compliant section wherein the pressure ridges are raised semicircular beads.
Figure 6:
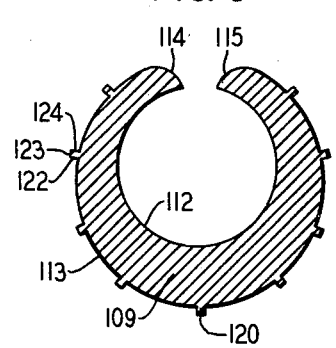
FIG. 6 is similar to FIG. 5 except the pressure ridges have a rectangular cross section.

In one embodiment of pin 100, compliant section 101 has a generally crescent-shaped cross section, as shown in FIG. 5, the thickness of which is smallest near tips 114 and 115 and largest at a midpoint between the two tips. The pressure ridges 120 in this embodiment are comprised of projections having a single, generally semicircular face 121. In another embodiment, shown in FIG. 6, pressure ridges 120 may be advantageously comprised of generally rectangular projections having first, second, and third faces 122, 123 and 124, respectively, first and third faces 122 and 124 being spaced apart and generally parallel with one another, while second face 123 is generally perpendicular to first and third faces 122 and 124.

Figure 7:
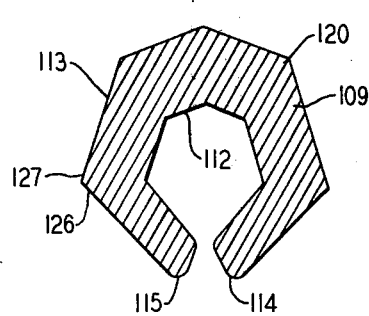
FIG. 7 is similar to FIG. 5 except the cross section has generally piecewise linear inner and outer surfaces.
Figure 8:
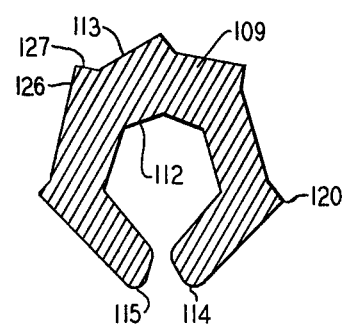
FIG. 8 is similar to FIG. 7 except the pressure ridges have a generally triangular-shaped cross section.

Further embodiments of compliant section 101 are shown in FIGS. 7 and 8. In these embodiments the cuplike-shaped cross section has generally polygonal-shaped inner and outer surfaces 112 and 113. Pressure ridges 120 for these two embodiments are formed by first and second faces 126 and 127 oriented at an angle between 90 degrees and 150 degrees with respect to one another.

Figure 11:
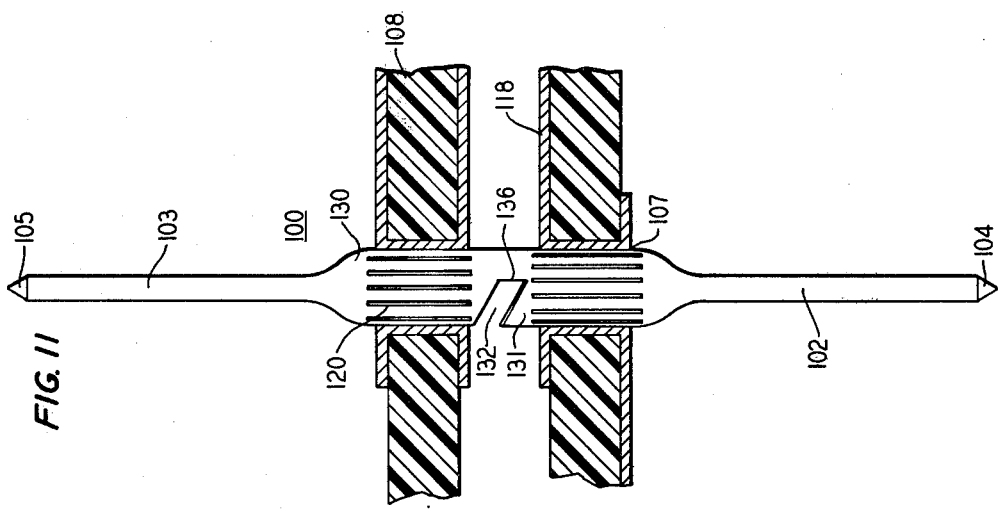
FIG. 11 illustrates stacking of two circuit boards with the connector illustrated in FIG. 9.
Figure 10:
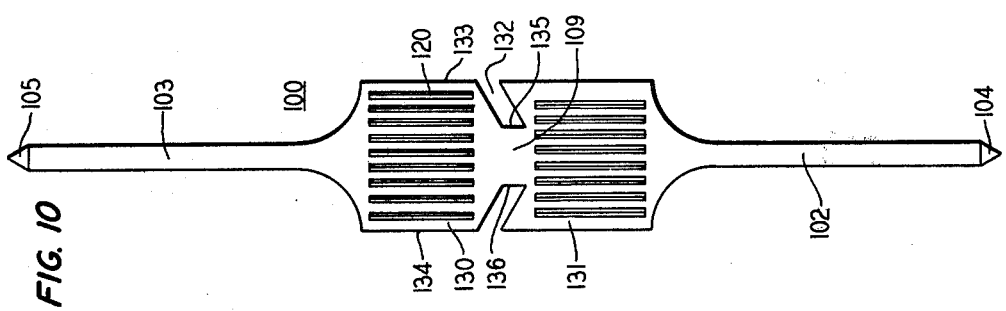
FIG. 10 is a side view of an unformed connector shown in FIG. 9.
Figure 9:
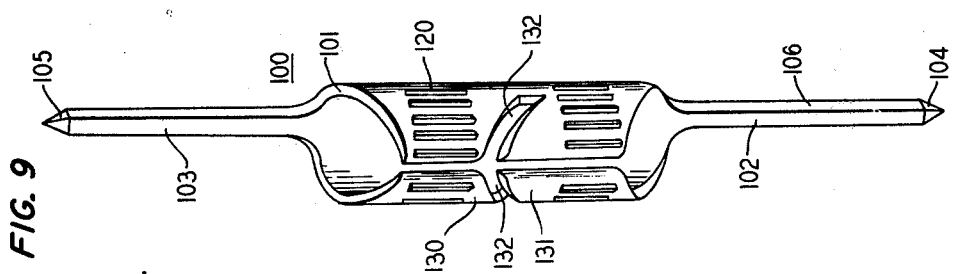
FIG. 9 is a perspective view similar to FIG. 1 illustrating the sectioning of the compliant portion to form semiseparate segments.

In applications where it is desirable to stack circuit boards 108 atop one another, pin 100 has its compliant section 101 segmented into a plurality of semiseparate sections 130 and 131, for example, as shown in FIGS. 9 and 10. Each section engages a separate circuit board 108 in an axially aligned stack of such boards as illustrated in FIG. 11. Segmentation of compliant section 101 into the plurality of semiseparate sections 130 and 131 is effected by one or more pairs of oppositely directed notches 132. Notches 132 extend from edges 133 and 134 of central portion 109 to intermediate points 135 and 136, respectively. Notches 132 are oriented at an angle between 30 and 90 degrees with respect to the axis of symmetry of pin 100.

Pressure ridges 120 on sections 130 and 131, in these embodiments of pin 100 are radially offset from one another. This radial offset of pressure ridges 120 ensures that sections 130 and 131 will each engage virgin conductive material 118 in aperture 107 as pin 100 passes through circuit boards 108 in an axial stack of boards. Consequently, all the advantages previously attributed to pressure ridges 120 resulting from their engagement with conductive material 118 at the periphery of aperture 107 in a single circuit board 108 are equally applicable to any additional boards 108 when a stack of such boards are to be interconnected.

A number of methods for fabricating a connector as described above may be advantageously utilized. One such method includes the steps of stamping a sheet of electrically conductive material to form first and second elongated terminals 102 and 103 with generally rectangular-shaped central portion 109 intermediate terminals 102 and 103. Central portion 109 is then swaged to produce a nonuniform thickness wherein the thickness along outer edges 133 and 134 of the central portion 109 is less than the thickness through central region 116.

Central portion 109 is then coined to produce the plurality of generally parallel pressure ridges 120. It should be noted that pressure ridges 120 produced by this operation are to be generally parallel with an axis of symmetry which passes through terminals 102 and 103 of pin 100. At the end of these three steps pin 100 has a shape as illustrated in either FIG. 3 or FIG. 10, depending upon whether pin 100 is to be used for a single board application or the stacking of two or more boards 108. Central portion 109 is then cupped to impart the generally cuplike-shaped cross section to compliant section 101 when the latter is viewed in a plane generally perpendicular to the axis of symmetry of pin 100. Finally, the distant ends of terminals 102 and 103 are coined to produce the generally tetrahedron-shaped tips 104 and 105 used to facilitate insertion of pin 100 into aperture 107 of circuit board 108.

Another method which may be utilized to fabricate pin 100 entails the extrusion of central portion 109 produced by the stamping operation to impart to it the generally cuplike-shaped cross section. In the extrusion operation the cuplike-shaped cross section is given a nonuniform thickness and pressure ridges 120 are formed directly on outer surface 113 of compliant section 101. The extrusion step in this method of fabrication replaces the swaging, coining, and cupping operations of the previously described method. As with the first method, the distant ends of terminals 102 and 103 are coined to produce the tetrahedron-shaped tips 104 and 105.

Still another method of fabricating pin 100 employs the stamping operation of the first two methods. However, in this method of fabrication, swaging is utilized to produce the nonuniform thickness of the pressure ridges 120. The swaged central portion 109 is then formed to impart the generally cuplike-shaped cross section. As before, the tetrahedron-shaped tips 104 and 105 are produced by coining the distant ends of terminals 102 and 103.

In all cases, it is to be understood that the above-described embodiments are illustrative of but a small number of many possible specific embodiments which can represent applications of the principles of the invention. Thus, numerous and various other embodiments can readily be devised in accordance with these principles by those skilled in the art without departing from the spirit and scope of the invention.

I claim:

1. A method for making a connector for electrically interconnecting multiple conductive layers in a circuit board having at least one aperture therein with electrically conductive material about its periphery comprising stamping a sheet of electrically conductive material to form first and second elongated members and a generally rectangular-shaped member intermediate said first and second elongated members, notching said generally rectangular-shaped member into a plurality of semiseparate sections, each of said sections having approximately the same configuration and also having a length along an axially disposed edge corresponding substantially to a thickness of a circuit board aperture wherein said section is engagable whereby each section is capable of engaging a separate printed circuit board in an axially aligned stack of such circuit boards, swaging said rectangular-shaped member to produce a nonuniform thickness with the thickness along edges of said rectangular-shaped member parallel with said first and second elongated members being smaller than the thickness through a central region of said rectangular-shaped member, coining said rectangular-shaped member to produce a plurality of generally parallel pressure ridges, said ridges being generally parallel with an axis of symmetry of said connector which passes through said first and second elongated members, cupping said rectangular-shaped member to impart a generally cuplike-shaped cross section in a plane generally perpendicular to said axis of symmetry whereby an outer surface of said rectangular shaped member exerts a nearly uniform radial pressure on adjacent conductive layers and coining distant ends off said first and second elongated members to produce generally tetrahedron-shaped tips.

2. A method for making a connector for electrically interconnecting multiple conductive layers in a circuit board having at least one aperture therein with electrically conductive material about its periphery comprising stamping a sheet of electrically conductive material to form first and second elongated members and a generally rectangular-shaped member intermediate said first and second elongated members, notching said generally rectangular-shaped member into a plurality of semiseparate sections, each of said sections having approximately the same configuration and also having a length along an axially disposed edge corresponding substantially to a thickness of a circuit board aperture wherein said section is engagable whereby each section is capable of engaging a separate circuit board in an axially aligned stack of such circuit boards, extruding said rectangular-shaped member to impart a generally cuplike-shaped cross section thereto which cross section lies in a plane generally perpendicular to an axis of symmetry of said connector, said cross section having a nonuniform thickness with the thickness along edges of said cross section parallel with said first and second elongated members being smaller than the thickness through a central region, said cross section further having a plurality of generally parallel pressure ridges on an outer surface, said ridges being generally parallel with said axis of symmetry whereby an outer surface of said rectangular shaped member exerts a nearly uniform radial pressure on adjacent conductive layers and coining distant ends of said first and second elongated members to produce generally tetrahedron-shaped tips.

3. A method for making a connector for electrically interconnecting multiple conductive layers in a circuit board having at least one aperture therein with electrically conductive material about its periphery comprising stamping a sheet of electrically conductive material to form first and second elongated members and a generally rectangular-shaped member intermediate said first and second elongated members, notching said generally rectangular-shaped member into a plurality of semiseparate sections, each of said sections having approximately the same configuration and also having a length along an axially disposed edge corresponding substantially to a thickness of a circuit board aperture wherein said section is engagable whereby each section is capable of engaging a separate printed circuit board in an axially aligned stack of such circuit boards, swaging said rectangular-shaped member to produce a nonuniform thickness, with the thickness along edges of said rectangular-shaped member parallel with said first and second elongated members being smaller than the thickness through a central region of said rectangular-shaped member, and a plurality of generally parallel pressure ridges, said ridges being generally parallel with an axis of symmetry of said connector which passes through said first and second elongated members, forming said rectangular-shaped member to impart a generally cuplike-shaped cross section in a plane generally perpendicular to said axis of symmetry, and coining distant ends of said first and second elongated members to produce generally tetrahedron-shaped tips.

* * * * *

UNITED STATES PATENT AND TRADEMARK OFFICE
CERTIFICATE OF CORRECTION

PATENT NO. : 4,155,321
DATED : May 22, 1979
INVENTOR(S) : Peter J. Tamburro

It is certified that error appears in the above-identified patent and that said Letters Patent are hereby corrected as shown below:

In the Abstract, line 9, "track" should read --stack--.
Column 1, line 43, "applicatons" should read --applications--.
Column 5, line 66, "off" should read --of--. Column 6, line 17, after the word "separate" insert the word --printed--;
line 63, after the word "symmetry" insert --whereby an outer surface of said rectangular shaped member exerts a nearly uniform radial pressure on adjacent conductive layers--.

Signed and Sealed this

Thirteenth Day of November 1979

[SEAL]

Attest:

RUTH C. MASON
Attesting Officer

LUTRELLE F. PARKER
Acting Commissioner of Patents and Trademarks